United States Patent
Schmid et al.

(10) Patent No.: US 9,455,154 B2
(45) Date of Patent: Sep. 27, 2016

(54) METHODS FOR FABRICATING GUIDE PATTERNS AND METHODS FOR FABRICATING INTEGRATED CIRCUITS USING SUCH GUIDE PATTERNS

(71) Applicant: GLOBALFOUNDRIES, Inc., Grand Cayman (KY)

(72) Inventors: Gerard M. Schmid, Rensselaer, NY (US); Richard Farrell, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 336 days.

(21) Appl. No.: 13/804,112

(22) Filed: Mar. 14, 2013

(65) Prior Publication Data
US 2014/0273475 A1    Sep. 18, 2014

(51) Int. Cl.
| | | |
|---|---|---|
| *H01L 21/308* | (2006.01) | |
| *H01L 21/311* | (2006.01) | |
| *G03F 7/004* | (2006.01) | |
| *G03F 7/20* | (2006.01) | |
| *H01L 21/3105* | (2006.01) | |
| *B81C 1/00* | (2006.01) | |

(52) U.S. Cl.
CPC ..... *H01L 21/31058* (2013.01); *B81C 1/00031* (2013.01); *H01L 21/3086* (2013.01); *B81C 2201/0149* (2013.01)

(58) Field of Classification Search
None
See application file for complete search history.

(56) References Cited

U.S. PATENT DOCUMENTS

| | | | |
|---|---|---|---|
| 2009/0176172 A1* | 7/2009 | Yamanaka et al. | 430/270.1 |
| 2009/0179002 A1* | 7/2009 | Cheng et al. | 216/41 |
| 2013/0078570 A1* | 3/2013 | Hieno et al. | 430/270.1 |
| 2013/0224635 A1* | 8/2013 | Takekawa | G03F 7/0002 430/5 |

* cited by examiner

*Primary Examiner* — Pamela E Perkins
(74) *Attorney, Agent, or Firm* — Lorenz & Kopf, LLP

(57) ABSTRACT

Methods for fabricating guide patterns and methods for fabricating integrated circuits using guide patterns are provided. In an embodiment, a method for fabricating a guide pattern includes forming a coating of a material with latent grafting sites and a photosensitive component configured to activate the latent grafting sites upon exposure over a substrate. The method exposes selected latent grafting sites in the coating to convert the selected latent grafting sites to active grafting sites. A grafting agent is bonded to the active grafting sites to form the guide pattern.

20 Claims, 8 Drawing Sheets

METHODS FOR FABRICATING GUIDE PATTERNS AND METHODS FOR FABRICATING INTEGRATED CIRCUITS USING SUCH GUIDE PATTERNS

TECHNICAL FIELD

The technical field generally relates to integrated circuits and methods for fabricating integrated circuits, and more particularly relates to methods for fabricating guide patterns used in the fabrication of integrated circuits and methods for fabricating integrated circuits using such guide patterns.

BACKGROUND

Integrated circuits are typically formed on a semiconductor substrate such as a silicon wafer or other semiconducting material. A continuing goal in integrated circuit processing is to reduce the size of individual electronic components thereby enabling smaller and denser integrated circuitry. One technique for patterning and processing semiconductor substrates is photolithography. Photolithography processes include deposition of a patternable mask, such as a photoresist mask, that is used to form patterns on semiconductor substrates. Photoresist materials can be processed to modify their solubility in certain solvents. For example, portions of a photoresist mask can be exposed to radiation to change the solvent solubility of the exposed regions versus the unexposed regions. Thereafter, the exposed or unexposed regions can be removed, depending on the type of photoresist, leaving masking patterns of the photoresist on the semiconductor substrates. Such processes can be repeated and/or coupled with other semiconductor processing steps to form features in semiconductor substrates.

The continual reduction in feature sizes of integrated circuits places ever greater demands on the techniques used to form the features. For example, photolithography is commonly used to form patterned features, such as conductive lines. A concept commonly referred to as "pitch" can be used to describe the sizes of the repeating patterned features in conjunction with adjacent spaces. Pitch may be defined as the distance between an identical point in two neighboring features of a repeating pattern, thereby including the maximum width of the feature and the adjacent space. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Directed self-assembly (DSA) materials are being studied for use in extending the capabilities of photolithographic techniques beyond their minimum pitch. Specifically, DSA materials may be formed over photographically defined guide patterns to reduce pitch between structures to less than that of the minimum photolithographic feature size. Particular DSA materials of note include copolymers containing two (or more) chemical components that have controlled sizes. These components can be bonded together into polymer chains known as diblocks, such as A-A-A-A-A-A-A-B-B-B-B-B-B-B, where A and B represent monomers. When formed over a guide pattern, the A and B monomers of a diblock copolymer are relatively disordered. However, these monomers (A and B) can be induced to separate into distinct phases and thereby form features with a characteristic dimension that is defined by the chemical composition of the guide pattern. By coating a diblock copolymer, or other DSA material, over a guide pattern, it is possible to "interpolate" the features between the guide patterns and reduce the pitch by a factor of 2-10 relative to the guide pattern. This can significantly reduce the cost and complexity of the processing that is used to create high resolution patterns.

However, known methods for creating DSA guide patterns have some limitations. For instance, existing processes for creating guide patterns typically involve plasma processing, low-throughput steps, or other processing that can increase the cost and complexity of the manufacturing process.

Accordingly, it is desirable to provide improved methods for fabricating guide patterns for fabricating integrated circuits. Further, it is desirable to provide methods for fabricating guide patterns for use with DSA materials to form masks having features smaller than the minimum feature size of current photolithographic processes. Also, it is desirable to provide methods for fabricating integrated circuits using masks formed with features smaller than the minimum photolithographic feature size. Furthermore, other desirable features and characteristics will become apparent from the subsequent detailed description and the appended claims, taken in conjunction with the accompanying drawings and the foregoing technical field and background.

BRIEF SUMMARY

Methods for fabricating guide patterns and methods for fabricating integrated circuits using guide patterns are provided. In accordance with an exemplary embodiment, a method for fabricating a guide pattern includes forming a coating of a material with latent grafting sites and a photosensitive component configured to activate the latent grafting sites upon exposure over a substrate. The method exposes selected latent grafting sites in the coating to convert the selected latent grafting sites to active grafting sites. A grafting agent is bonded to the active grafting sites to form the guide pattern.

In another embodiment, a method for fabricating an integrated circuit includes forming a guide pattern. The guide pattern is formed by depositing a coating of a material including latent grafting sites and a photosensitive component configured to activate the latent grafting sites upon exposure over a substrate, exposing selected latent grafting sites in the coating to convert the selected latent grafting sites to active grafting sites, and bonding a grafting agent to the active grafting sites, thus forming a guide pattern. In the method, a directed self-assembly (DSA) material is coated over the guide pattern and annealed. This results in the formation of a structure that can be used as a mask. The structures can transferred to a semiconductor substrate to form the integrated circuit by additional semiconductor processing steps.

In accordance with another embodiment, a method for fabricating a guide pattern on a substrate is provided. The method includes providing a substrate including a material having latent grafting sites. Selected latent grafting sites in the coating are activated to convert the selected latent grafting sites to active grafting sites. Further, a grafting agent is bonded to the active grafting sites.

BRIEF DESCRIPTION OF THE DRAWINGS

Embodiments of methods for fabricating guide patterns and integrated circuits will hereinafter be described in conjunction with the following drawing figures, wherein like numerals denote like elements, and wherein.

DETAILED DESCRIPTION

The following detailed description is merely exemplary in nature and is not intended to limit guide patterns, methods for fabricating guide patterns, masks, methods for fabricating masks, integrated circuits, or methods for fabricating integrated circuits as described and/or claimed herein. Furthermore, there is no intention to be bound by any expressed or implied theory presented in the preceding technical field, background or brief summary, or in the following detailed description.

In accordance with the various embodiments herein, methods for fabricating guide patterns and methods for fabricating integrated circuits are provided. Problems faced by conventional processes when forming guide patterns for directed self-assembly (DSA) materials, such as block copolymers, may be avoided. For example, existing processes for creating guide patterns typically involve plasma processing, low-throughput steps, or other processing that can increase the cost and complexity of the manufacturing process. These expensive or time consuming process steps are avoided herein. Instead, the methods described herein create chemical regions or patterns by bonding grafting agents to photoactivated sites.

Various photolithographic or semiconductor processing steps are well known and so, in the interest of brevity, many conventional steps will only be mentioned briefly herein or will be omitted entirely without providing the well-known process details. Further, it is noted that guide patterns and integrated circuits include a varying number of components and that single components shown in the illustrations may be representative of multiple components.

Figure 1:
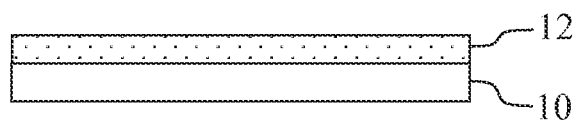
FIGS. 1-5 illustrate, in cross section, a portion of a guide pattern and method steps for fabricating a guide pattern in accordance with various embodiments herein.

FIGS. 1-5 illustrate steps in accordance with an embodiment of a method for fabricating a guide pattern. In FIG. 1, in an exemplary embodiment, the method for fabricating a guide pattern begins by providing a substrate 10 including material to be patterned during fabrication of an integrated circuit. For example, the substrate 10 may be a semiconductor material such as bulk silicon, a silicon-on-insulator material, or a substrate of an electrically conductive layer or an electrically insulating layer for a semiconductor element. Substrate 10 might also include one or more layers of etch mask materials, planarizing materials, and/or materials that control the optical reflectivity of the substrate.

In FIG. 1, a material is deposited over the upper surface of the substrate 10 to form a coating 12. The coating 12 includes a source for latent grafting sites and a photosensitive component configured to activate the latent grafting sites upon exposure. Examples of a source of latent grafting sites include t-butoxycarbonyloxystyrene, t-butylmethacrylate, diazonapthoquinone, and nitrobenzyl esters. An exemplary photosensitive component is subject to radiation-induced cleavage so that a portion of the photosensitive component is released upon sufficient exposure to radiation. For example, the photosensitive component may be a photoacid generator (PAG), diazonaphthoquinone, or nitrobenzyl esters.

Figure 2:
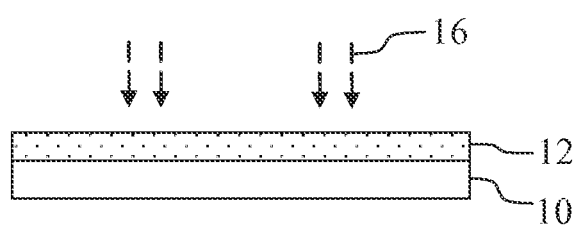
Figure 3:
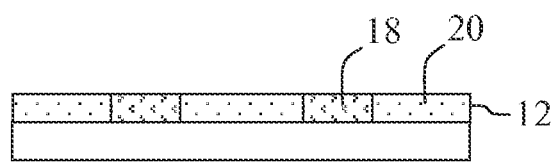

In FIG. 2, the coating 12 is patterned in a photolithography process. As shown, the coating 12 is selectively exposed to radiation 16. For example, ultraviolet light 16 may be directed to contact selected portions of the coating 12 to create exposed region 18 as shown in FIG. 3.

While grafting sites in the non-exposed region 20 remain latent, the latent grafting sites in the exposed region 18 are converted to active grafting sites either by the exposure to radiation 16 or by the exposure plus additional processing. For example, a post exposure bake process may be performed to thermally convert the latent grafting sites in the exposed region 18 to active grafting sites. In an exemplary embodiment, the post exposure bake process is performed at about 100° C. to about 120° C. In an exemplary process, the photoacid generator creates acid upon exposure to radiation 16. During a post exposure bake process, the acid deprotects the latent grafting sites in region 18 to form active grafting sites.

Figure 4:
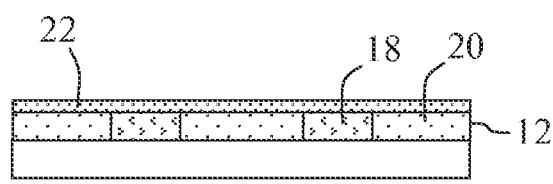

After activating grafting sites in the exposed region 18, a grafting agent 22 is deposited over the coating 12, as illustrated in FIG. 4. The grafting agent 22 is selected for its interaction with a DSA material used later in the process. Specifically, the grafting agent 22 may be preferential toward or have an affinity for bonding to one of the components of the DSA material relative to a second component of the DSA material. For instance, if the DSA material is a diblock copolymer including a polystyrene component, then a polystyrene grafting agent may be used to create the guide pattern, as the polystyrene component of the DSA will have energetically favorable interactions with the polystyrene grafting agent 22. An exemplary grafting agent 22 is polymeric polystyrene with an epoxy end group. Alternatively, the grafting agent 22 may be neutral toward the components of the DSA material. As used herein, a grafting agent has a preferential interaction with a DSA material, or more precisely with a component of a DSA material, if the grafting agent has an interaction with one component of the DSA material that is substantially favorable relative to another component. As used herein, a grafting agent has a substantially neutral interaction with a DSA material if the grafting agent has substantially similar interactions with two or more components of the DSA material.

Figure 5:
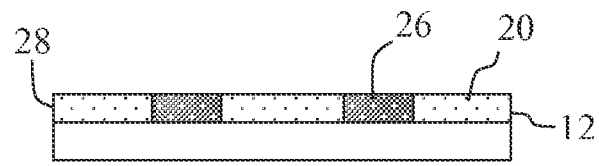

The grafting agent 22 bonds to the active sites in region 18 of the coating 12 to form a DSA interaction region 26 as shown in FIG. 5. For an exemplary epoxy-terminated grafting agent 22, the epoxy end of the grafting agent will bond to the active sites in region 18. Bonding of the grafting agent 22 to the active sites may be facilitated by a bake process. Further, as shown in FIG. 5, the grafting agent 22 does not bond to the latent grafting sites in the region 20. After bonding the grafting agent 22 in the exposed region 18, the remainder of the grafting agent 22, i.e., the grafting agent overlying the region 20 may be removed, such as by a rinse process. In embodiments in which the coating 12 in region 20 is neutral toward the DSA material as initially deposited, the region 20 serves as a neutral DSA interaction region and the guide pattern 28 is completed as shown in FIG. 5 without further processing. Fabrication of an integrated circuit may continue using the method illustrated in FIGS. 27-30 below.

FIGS. 6-9 illustrate additional steps for further processing of the guide pattern 28 fabricated in accordance with the embodiment of FIGS. 1-5. Specifically, FIGS. 6-9 illustrate steps performed when the coating 12 in region 20 is not neutral toward the later-used DSA material. The steps of FIGS. 6-9 cause the coating 12 in region 20 to be neutral toward the later-used DSA material.

Figure 6:
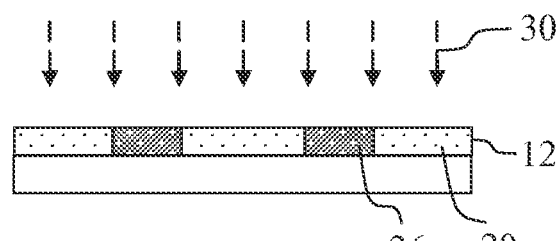
FIGS. 6-9 illustrate, in cross section, additional steps for processing the guide pattern of FIGS. 1-5 in accordance with various embodiments herein.
Figure 7:
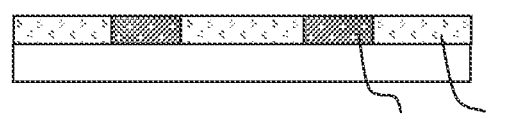

In FIG. 6, following the steps of FIG. 5, a flood exposure, i.e., a non-patterned exposure, is performed with radiation 30, such as ultraviolet light. This process photo-activates the latent grafting sites in region 20 of the coating 12 to form exposed region 32 with activated grafting sites shown in FIG. 7. As indicated above in relation to the earlier grafting site activation, a post exposure bake process may be performed to thermally convert the exposed latent grafting sites to active grafting sites.

Figure 8:
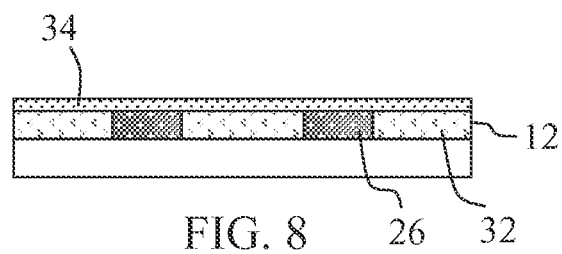

In FIG. 8, a second grafting agent 34 is deposited over the coating 12. The grafting agent 34 is selected for its interaction with a DSA material used later in the process. Specifically, the grafting agent 34 is neutral toward the two or more components of the DSA material. For example, the grafting agent 34 may include a mixture of a first portion of agents having a preferential interaction with a first component of the DSA material and a second portion of agents having a preferential interaction with a second component of the DSA material. An exemplary first portion of the second grafting agent 34 is the same as the first grafting agent. For example, when the DSA material selected for use is polystyrene-b-polymethyl methacrylate (PS-b-PMMA) diblock polymer, the first grafting agent 22 may be polystyrene polymer with an epoxy end group and the second grafting agent 34 may include a first portion of polystyrene polymer with an epoxy end group and a second portion of polymethyl methacrylate with an epoxy end group.

Figure 9:
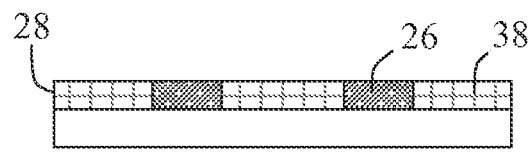

The second grafting agent 34 bonds to the activated grafting sites in region 32 of coating 12 to form a neutral DSA interaction region 38 as shown in FIG. 9. Bonding of the grafting agent 34 to the active sites may be facilitated by a bake process. As shown, the grafting agent 34 does not bond to the DSA interaction region 26. After bonding the grafting agent 34 to activated grafting sites in region 32, the remainder of the grafting agent 34, i.e., the grafting agent overlying the DSA interaction region 26 may be removed, such as by a rinse process. FIG. 9 shows a completed guide pattern 28 with DSA interaction regions 26 and 38 that exhibit different preferences for interacting with a DSA material. Fabrication of an integrated circuit may continue using the method illustrated in FIGS. 27-30 below.

Figure 10:
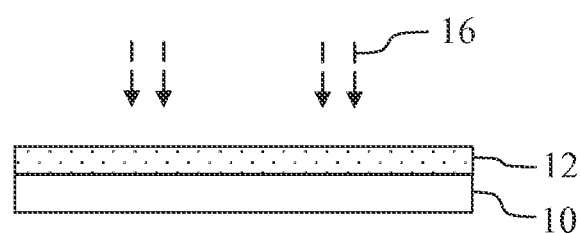
FIGS. 10-16 illustrate, in cross section, a portion of a guide pattern and method steps for fabricating a guide pattern in accordance with other embodiments herein.
Figure 11:
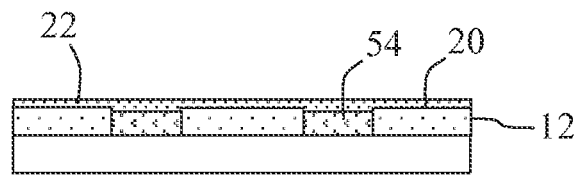

FIGS. 10-16 illustrate steps in accordance with another embodiment for fabricating a guide pattern. In FIG. 10, a material has been deposited over the upper surface of substrate 10 to form a coating 12. The coating material includes latent grafting sites and a photosensitive component configured to activate the latent grafting sites upon exposure. An exemplary coating material includes t-butyl methacrylate polymer as the source of the latent grafting sites and photoacid generator as the photosensitive component. In FIG. 10, a photolithography process is performed to selectively expose portions of the coating 12 to radiation 16. For example, a dose of about 100 millijoules per square centimeter (mJ/cm$^2$) or less of ultraviolet light may be selectively directed at the coating 12 to create exposed region 54 as shown in FIG. 11.

The photoacid generator creates a catalytic superacid in region 54 upon exposure to a sufficient dose of radiation 16. Further processing converts the latent grafting sites in region 54 to active grafting sites. Specifically, a post exposure bake process is performed to react the superacid with the t-butyl methacrylate polymer to form polymethacrylic acid, which is the source of active grafting sites. As shown in FIG. 11, some mass loss occurs during this process. Grafting sites in region 20 remain latent.

Figure 12:
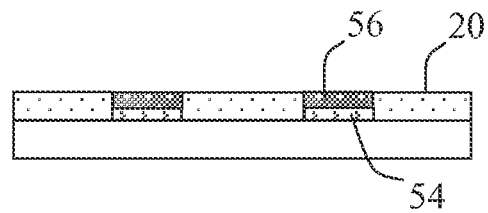

In FIG. 11, polymeric polystyrene with an epoxy end group is deposited as a grafting agent 22 over the activated grafting sites in region 54 and the remainder of the coating 12. The grafting agent 22 bonds to the active sites in the regions 54 of the coating 12 to form a DSA interaction region 56 as shown in FIG. 12. The epoxy end group of the grafting agent grafts to the active grafting sites in region 54 while the polymeric polystyrene end provides for preferential interaction with polystyrene components of a DSA material to be used in later processing. Bonding of the grafting agent 22 to the active sites is facilitated by a bake process. As shown, the grafting agent 22 does not bond to the latent grafting sites in region 20. After bonding the grafting agent 22 to region 54, the remainder of the grafting agent 22, i.e., the grafting agent 22 overlying region 20 may be removed, such as by a rinse process.

Figure 13:
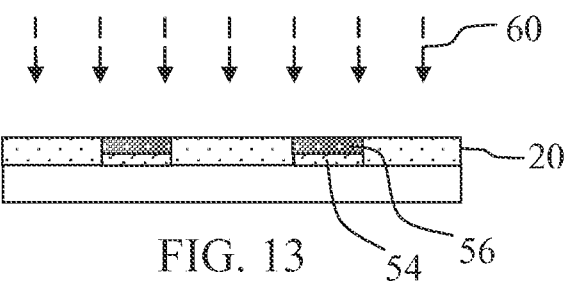
Figure 14:
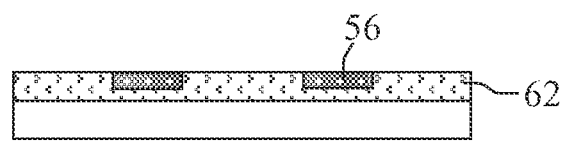

In FIG. 13, a flood exposure, i.e., non-patterned exposure, is performed with radiation 60. Again, a dose of about 100 millijoules per square centimeter (mJ/cm$^2$) or less may be directed at the coating 12 to activate latent grafting sites in the region 20 to form exposed region 62 as shown in FIG. 14. Again, this process causes the photoacid generator to create catalytic superacid. A bake process may be performed to facilitate reaction of the catalytic superacid with the poly(t-butyl methacrylate) to form polymethacrylic acid as the source of active grafting sites.

Figure 15:
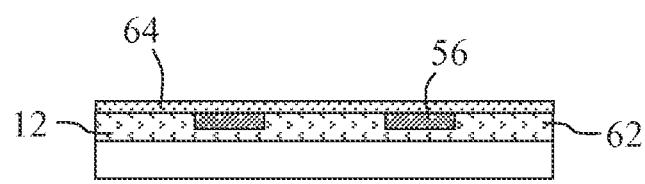

In FIG. 15, a second grafting agent 64 is deposited over the coating 12. An exemplary grafting agent 64 is a mixture of polystyrene polymer with an epoxy end group and polymethyl methacrylate with an epoxy end group. The relative concentration of polystyrene polymer with an epoxy end group and polymethyl methacrylate with an epoxy end group may be selectively varied to tune the surface chemistry of the second grafting agent 64. Further, it is noted that the two components within the second grafting agent 64 are miscible and do not undergo microphase separation.

Figure 16:
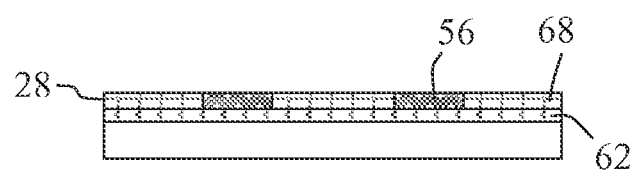

The second grafting agent 64 bonds to the activated grafting sites in region 62 of coating 12 to form a neutral DSA interaction region 68 as shown in FIG. 16. Bonding of the grafting agent 34 to the active sites is facilitated by a bake process. As shown, the grafting agent 64 does not bond to the DSA interaction region 56. After bonding the grafting agent 64 to activated grafting sites in region 62, the remainder of the grafting agent 64, i.e., the grafting agent overlying the DSA interaction region 56 may be removed, such as by a rinse process. FIG. 16 shows a completed guide pattern 28 with regions 56 and 68 that exhibit different preferences for interacting with a DSA material when using polystyrene-b-polymethyl methacrylate (PS-b-PMMA) as the DSA material. Fabrication of an integrated circuit may continue using the method illustrated in FIGS. 27-30 below.

Figure 17:
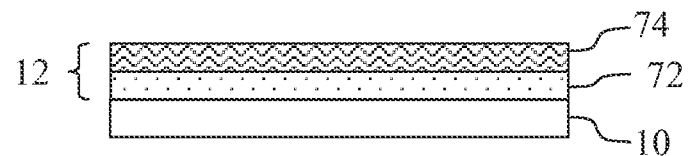
FIGS. 17-21 illustrate, in cross section, a portion of a guide pattern and method steps for fabricating a guide pattern in accordance with an embodiment herein.

FIGS. 17-21 illustrate another method for fabricating a guide pattern. In FIG. 17, a material is coated over the substrate 10 to form coating layer 72 including latent grafting sites. Another material is coated over the coating layer 72 to form coating layer 74 including a photosensitive component. Together, coating layers 72 and 74 may be considered to form coating 12. In an exemplary embodiment, the coating layer 72 includes latent grafting sites that are activated by acid catalysis and the coating layer 74 is a chemically amplified photoresist that generates acid when exposed to radiation such as ultraviolet light.

Figure 18:
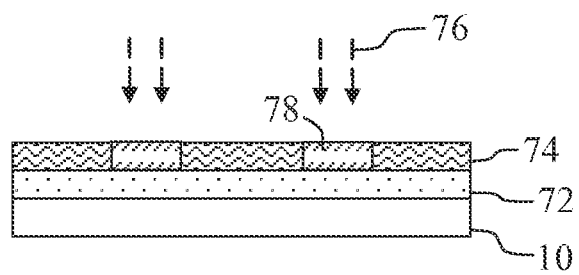
Figure 19:
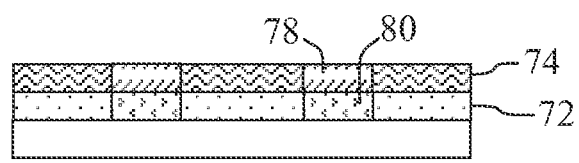

In FIG. 18, a portion of the coating layer 74 corresponding to the feature or the field is exposed to radiation 76, such as ultraviolet light, to form exposed region 78 in the coating layer 74. The coating layer 74 generates acid in region 78. In FIG. 19, a bake process causes the acid in region 78 to diffuse into the coating layer 72 to form a region 80 of activated grafting sites.

Figure 20:
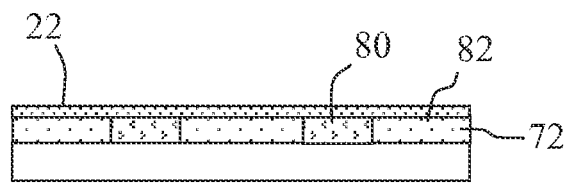

In FIG. 20, coating layer 74 has been removed after forming region 80 and a grafting agent 22 has been deposited over the coating layer 72. The grafting agent 22 is selected for its interaction with a DSA material used later in the process. Specifically, the grafting agent 22 may be preferential toward or have an affinity for interacting with a first component of a DSA material relative to a second component of the DSA material. For instance, if the DSA material is a diblock copolymer including a polystyrene component, then a polystyrene grafting agent may be used, as the polystyrene component of the DSA will prefer to interact with the polystyrene grafting agent 22. An exemplary grafting agent 22 is polymeric polystyrene with an epoxy end group. Alternatively, the grafting agent 22 may be neutral toward the components of the DSA material.

Figure 21:
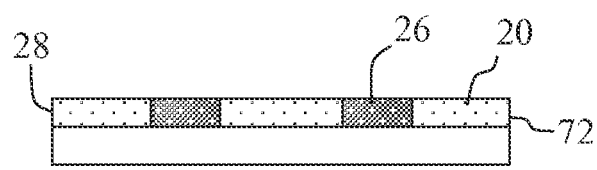

The grafting agent selectively bonds to the activated sites in region 80 as described above to form a DSA interaction region 26 as shown in FIG. 21. For an exemplary epoxy-terminated grafting agent 22, the epoxy end of the grafting agent will bond to the active sites in region 80. Bonding of the grafting agent 22 to the active sites may be facilitated by a bake process. Further, as shown in FIG. 21, the grafting agent 22 does not bond to the latent grafting sites in the region 20. After bonding the grafting agent 22 in the exposed region 80, the remainder of the grafting agent 22, i.e., the grafting agent overlying the region 20 may be removed, such as by a rinse process. In embodiments in which the coating layer 72 in region 20 is neutral toward the DSA material as initially deposited, the region 20 serves as a neutral DSA interaction region and the guide pattern 28 is completed as shown in FIG. 21 without further processing. Fabrication of an integrated circuit may continue using the method illustrated in FIGS. 27-30 below.

FIGS. 22-26 illustrate additional steps for further processing of the guide pattern 28 fabricated in accordance with the embodiment of FIGS. 17-21. Specifically, FIGS. 22-26 illustrate steps performed when the coating layer 72 in region 20 is not neutral toward the later-used DSA material. The steps of FIGS. 22-26 cause the coating layer 72 in region 20 to be neutral toward the later-used DSA material.

Figure 22:
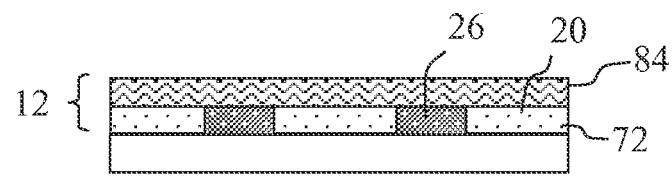
FIGS. 22-26 illustrate, in cross section, additional steps for processing the guide pattern of FIGS. 17-21 in accordance with various embodiments herein.

In FIG. 22, following the steps of FIG. 21, another photosensitive material is coated over the coating layer 72 to form second coating layer 84 including a photosensitive component. Together, coating layers 72 and 84 may be considered to form coating 12. In an exemplary embodiment, the coating layer 84 is a chemically amplified photoresist that generates acid when exposed to radiation such as ultraviolet light.

Figure 23:
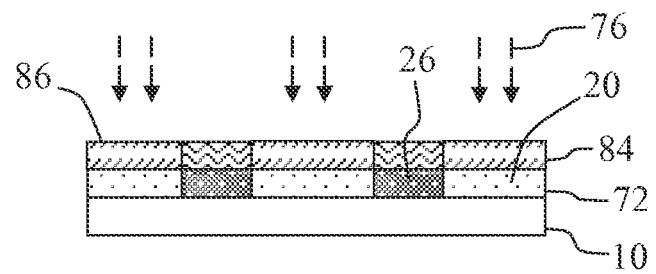
Figure 24:
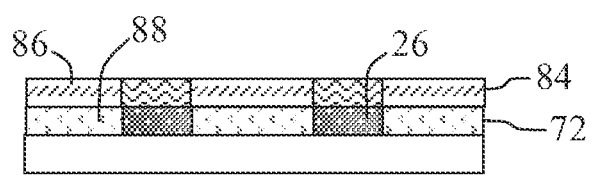

In FIG. 23, a portion of the coating layer 84 corresponding to the field or the feature is exposed to radiation 76, such as ultraviolet light, to form exposed region 86 in the coating layer 84. The coating layer 84 generates acid in region 86. In FIG. 24, a bake process causes the acid in region 86 to diffuse into the coating layer 72 to form a region 88 of activated grafting sites. It is noted that exposed region 86 might include some or all of regions 26.

Figure 25:
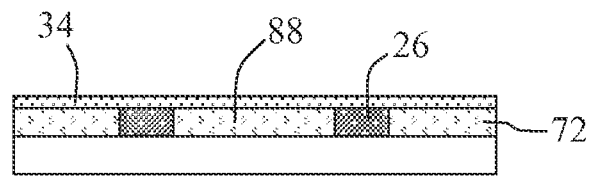

In FIG. 25, coating layer 84 has been removed after forming region 88 and a second grafting agent 34 has been deposited over the coating layer 72. The grafting agent 34 is selected for its interaction with a DSA material used later in the process. Specifically, the grafting agent 34 is neutral toward two or more of the components of the DSA material. For example, the grafting agent 34 may include a mixture of a first portion of agents having a preferential interaction with a first component of the DSA material and a second portion of agents having a preferential interaction with a second component of the DSA material. An exemplary first portion of the second grafting agent 34 is the same as the first grafting agent. For example, when the DSA material selected for use is polystyrene-b-polymethyl methacrylate (PS-b-PMMA) diblock polymer, the first grafting agent 22 may be polystyrene polymer with an epoxy end group and the second grafting agent 34 may include a first portion of polystyrene polymer with an epoxy end group and a second portion of polymethyl methacrylate with an epoxy end group.

Figure 26:
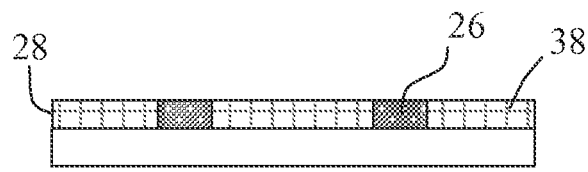

The second grafting agent 34 bonds to the activated grafting sites in region 88 of coating layer 72 to form a neutral DSA interaction region 38 as shown in FIG. 26. Bonding of the grafting agent 34 to the active sites may be facilitated by a bake process. As shown, the grafting agent 34 does not bond to the DSA interaction region 26. After bonding the grafting agent 34 to activated grafting sites in region 88, the remainder of the grafting agent 34, i.e., the grafting agent overlying the DSA interaction region 26 may be removed, such as by a rinse process. FIG. 26 shows a completed guide pattern 28 with DSA interaction regions 26 and 38 that exhibit different preferences for bonding with a DSA material. Fabrication of an integrated circuit may continue using the method illustrated in FIGS. 27-30 below.

Figure 27:
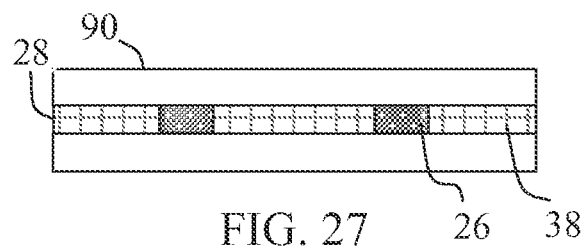
FIGS. 27-29 illustrate, in cross section, a guide pattern and method steps for forming a mask from the guide pattern in accordance with embodiments herein.
Figure 28:
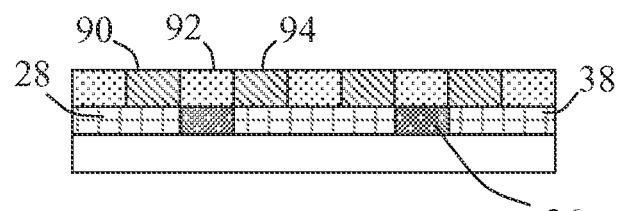
Figure 29:
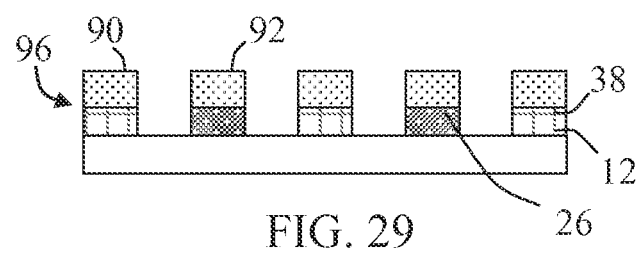

Referring now to FIGS. 27-29, a guide pattern 28 is used to fabricate a mask having features smaller than the minimum feature size of current photolithographic processes. In FIG. 27, a DSA material 90 is deposited over a guide pattern 28 fabricated according to any of the methods disclosed in FIGS. 1-26. The DSA material may be deposited using any suitable method, including, for example, spin-on methods. The DSA material 90 includes at least two components which self-assemble after application to the guide pattern 28. In an exemplary embodiment, the DSA material 90 is a diblock copolymer. Other DSA materials include triblock copolymers, star copolymers, ring copolymers, brush copolymers, polymer blends, and mixtures thereof.

As shown in FIG. 28, the DSA material self-assembles by phase separation over the guide pattern 28 to form distinct phases of its two (or more) components 92 and 94. Self-assembly of the DSA material may be induced by, for example, thermal processing. Specifically, a bake process may be performed near or below the glass transition temperature of the DSA material 90, causing the DSA material 90 to self-assemble.

In FIG. 28, the DSA material has self-assembled into a lamellar structure over the guide pattern 28. Specifically, a component 92 of the DSA material 90 has become preferentially oriented over the DSA interaction region 26.

In FIG. 29, component 94 of the DSA material 90 and the coating 12 underlying component 94 of the DSA material 90 are removed. For example, an anisotropic etch may be performed to remove component 94 and the underlying coating 12. Selective removal of component 94 may include selectively etching component 94 relative to component 92. As a result of the removal of component 94, a mask 96 is formed having feature sizes smaller than those of guide pattern 28, and smaller than the minimum photolithography feature size.

Figure 30:
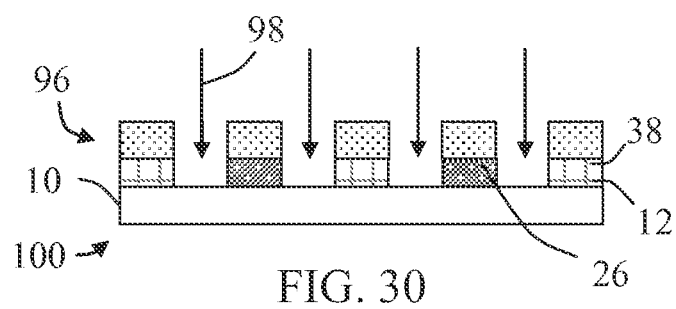
FIG. 30 illustrates, in cross section, a portion of an integrated circuit and method steps for forming an integrated circuit using a mask formed from a guide pattern in accordance with embodiments herein.

In FIG. 30, the mask 96 is used to pattern or otherwise process a semiconductor substrate 10. As shown, an etchant 98 or other process element may be passed through the mask 96 into contact with the semiconductor substrate 10 to etch semiconductor substrate 10. As result of such processing and additional process steps, an integrated circuit 100 may be formed.

The methods described herein provide for improved process steps for forming guide patterns for organizing DSA materials. The methods avoid plasma processing, low-throughput steps, and other processing that can increase the cost and complexity of the manufacturing process. Instead, the methods create chemical patterns by bonding grafting agents to photoactivated sites. Further, this approach greatly facilitates optimization of the interactions of the guide surface with the DSA materials.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a guide pattern comprising:
    forming a coating of a material including latent grafting sites and a photosensitive component configured to activate the latent grafting sites upon exposure over a substrate;
    exposing selected latent grafting sites in the coating to convert the selected latent grafting sites to active grafting sites;
    bonding a first grafting agent to the active grafting sites;
    exposing a remaining portion of the coating to convert remaining latent grafting sites to active grafting sites; and
    bonding a second grafting agent to the active grafting sites in the remaining portion of the coating.

2. The method of claim 1 wherein forming a coating of a material comprises:
    forming a first layer including the latent grafting sites over the substrate; and
    forming a second layer including the photosensitive component over the first layer; and wherein the method further comprises removing the second layer after exposing and before bonding the first grafting agent.

3. The method of claim 1 wherein coating the directed self-assembly (DSA) material over the guide pattern comprises depositing the directed self-assembly (DSA) material onto the guide pattern, and wherein the method further comprises inducing self-assembly of the DSA material.

4. The method of claim 1 wherein coating the directed self-assembly (DSA) material over the guide pattern comprises depositing the directed self-assembly (DSA) material onto the guide pattern, and wherein the method further comprises inducing self-assembly of the DSA material by thermally processing the DSA material.

5. The method of claim 1 wherein coating the directed self-assembly (DSA) material over the guide pattern comprises depositing the directed self-assembly (DSA) material onto the guide pattern.

6. The method of claim 1 wherein the guide pattern has an upper surface, wherein coating the directed self-assembly (DSA) material over the guide pattern comprises depositing the directed self-assembly (DSA) material onto the upper surface of the guide pattern, and wherein the directed self-assembly (DSA) material self-assembles over the upper surface of the guide pattern.

7. The method of claim 1 wherein exposing selected latent grafting sites in the coating to convert the selected latent grafting sites to active grafting sites comprises exposing selected regions of the coating, wherein the directed self-assembly (DSA) material includes a first component and a second component, and wherein the directed self-assembly (DSA) material self-assembles into a structure in which only the first component is located over the selected regions of the coating.

8. The method of claim 7 wherein the directed self-assembly (DSA) material self-assembles into the structure in which the first component and the second component are located over non-selected regions of the coating.

9. The method of claim 7 wherein a first portion of the coating lies under the first component and a second portion of the coating lies under the second component, and wherein the method further comprises removing a selected component of the directed self-assembly (DSA) material and the respective portion of the coating lying under the selected component such that all of the selected region of the coating is removed or none of the selected region of the coating is removed.

10. A method for fabricating a guide pattern comprising:
    forming a first layer of a coating of a material including latent grafting sites over a substrate;
    forming a second layer of the coating including a photosensitive component configured to activate the latent grafting sites upon exposure over the first layer;
    exposing selected latent grafting sites in the coating to convert the selected latent grafting sites to active grafting sites;
    removing the second layer after exposing the selected latent grafting sites;
    bonding a grafting agent to the active grafting sites to form the guide pattern after removing the second layer; and
    coating a directed self-assembly (DSA) material over the guide pattern.

11. The method of claim 10 wherein the DSA material includes a first component and a second component; and wherein the method further comprises etching the second component and the coating underlying the second component to form a mask.

12. The method of claim 10 wherein exposing comprises performing a pattern-wise exposure of the coating to radiation followed by thermally treating the coating to convert the selected latent grafting sites to active grafting sites.

13. The method of claim 10 wherein bonding comprises:
    depositing the grafting agent over the coating;
    thermally treating the substrate; and
    rinsing non-bonded portions of the grafting agent from the substrate.

14. The method of claim 10 wherein bonding comprises bonding a first grafting agent having a first interaction with the directed self-assembly (DSA) material to the active grafting sites, and wherein the method further comprises:

after bonding the first grafting agent to the active grafting sites, exposing a remaining portion of the coating to convert remaining latent grafting sites to active grafting sites;

bonding a second grafting agent having a second interaction with the directed self-assembly (DSA) material to the active grafting sites in the remaining portion of the coating wherein the second interaction is different from the first interaction; and wherein coating the directed self-assembly (DSA) material over the guide pattern comprises coating the directed self-assembly (DSA) material over the first grafting agent and the second grafting agent, wherein the directed self-assembly (DSA) material self-assembles on the first grafting agent and the second grafting agent.

15. The method of claim 10 wherein bonding the grafting agent to the active grafting sites to form the guide pattern comprises depositing the grafting agent over the coating of the material, wherein the grafting agent does not bond to the latent grafting sites in the coating of the material.

16. The method of claim 15 further comprising rinsing the grafting agent from the latent grafting sites in the coating of the material.

17. The method of claim 10 wherein the grafting agent is not a diblock copolymer.

18. The method of claim 10 wherein the grafting agent is polymeric polystyrene with an epoxy end group.

19. The method of claim 10 wherein the grafting agent includes epoxy end groups.

20. A method for fabricating a guide pattern comprising:

forming a coating of a material including latent grafting sites and a photosensitive component configured to activate the latent grafting sites upon exposure over a substrate;

exposing selected latent grafting sites in the coating to convert the selected latent grafting sites to active grafting sites;

bonding a first grafting agent to the active grafting sites to form the guide pattern;

after bonding the first grafting agent to the active grafting sites, exposing a remaining portion of the coating to convert remaining latent grafting sites to active grafting sites;

bonding a second grafting agent to the active grafting sites in the remaining portion of the coating; and coating a directed self-assembly (DSA) material over the guide pattern.

* * * * *